(12) United States Patent
Sommer et al.

(10) Patent No.: US 7,924,613 B1
(45) Date of Patent: Apr. 12, 2011

(54) DATA STORAGE IN ANALOG MEMORY CELLS WITH PROTECTION AGAINST PROGRAMMING INTERRUPTION

(75) Inventors: Naftali Sommer, Rishon Le-Zion (IL); Shai Winter, Givatayim (IL); Ofir Shalvi, Ra'anana (IL)

(73) Assignee: Anobit Technologies Ltd., Herzliya Pituach (IL)

( * ) Notice: Subject to any disclaimer, the term of this patent is extended or adjusted under 35 U.S.C. 154(b) by 0 days.

(21) Appl. No.: 12/497,707

(22) Filed: Jul. 6, 2009

Related U.S. Application Data

(60) Provisional application No. 61/086,164, filed on Aug. 5, 2008, provisional application No. 61/086,541, filed on Aug. 6, 2008, provisional application No. 61/093,461, filed on Sep. 2, 2008.

(51) Int. Cl.
*G11C 11/34* (2006.01)
(52) U.S. Cl. .................................. 365/185.03
(58) Field of Classification Search ............... 365/185.03
See application file for complete search history.

(56) References Cited

U.S. PATENT DOCUMENTS

| | | | |
|---|---|---|---|
| 4,556,961 A * | 12/1985 | Iwahashi et al. | |
| 4,558,431 A * | 12/1985 | Satoh | |
| 4,661,929 A * | 4/1987 | Aoki et al. | |
| 4,768,171 A * | 8/1988 | Tada | |
| 4,811,285 A * | 3/1989 | Walker et al. | |
| 4,899,342 A * | 2/1990 | Potter et al. | |
| 4,910,706 A * | 3/1990 | Hyatt | |
| 4,993,029 A * | 2/1991 | Galbraith et al. | |
| 5,077,722 A | 12/1991 | Geist et al. | |
| 5,126,808 A | 6/1992 | Montalvo et al. | |
| 5,163,021 A * | 11/1992 | Mehrotra et al. | |
| 5,172,338 A * | 12/1992 | Mehrotra et al. | |
| 5,191,584 A * | 3/1993 | Anderson | |
| 5,200,959 A * | 4/1993 | Gross et al. | |
| 5,237,535 A * | 8/1993 | Mielke et al. | |
| 5,272,669 A * | 12/1993 | Samachisa et al. | |
| 5,276,649 A | 1/1994 | Hoshita et al. | |
| 5,287,469 A | 2/1994 | Tsuboi | |
| 5,365,484 A | 11/1994 | Cleveland et al. | |

(Continued)

FOREIGN PATENT DOCUMENTS

EP 0783754 B1 7/1997

(Continued)

OTHER PUBLICATIONS

U.S. Appl. No. 12/019,011 Official Action dated Nov. 20, 2009.

(Continued)

*Primary Examiner* — Hoai V Ho
*Assistant Examiner* — Anthan T Tran
(74) *Attorney, Agent, or Firm* — D. Kligler I.P. Services Ltd

(57) ABSTRACT

A method for data storage includes storing first data in analog memory cells using a first programming operation, which writes to the memory cells respective analog values representing respective bit values of the first data. Second data is stored in the analog memory cells in addition to the first data using a second programming operation, which modifies the respective analog values of the memory cells so as to represent bit value combinations of the first and second data. The first and second programming operations are defined such that, at all times during the second programming operation, the analog value of each memory cell remains unambiguously indicative of the respective bit value of the first data stored in that memory cell.

15 Claims, 4 Drawing Sheets

U.S. PATENT DOCUMENTS

| | | | |
|---|---|---|---|
| 5,388,064 A * | 2/1995 | Khan | |
| 5,416,646 A | 5/1995 | Shirai | |
| 5,416,782 A | 5/1995 | Wells et al. | |
| 5,473,753 A * | 12/1995 | Wells et al. | |
| 5,479,170 A * | 12/1995 | Cauwenberghs et al. | |
| 5,508,958 A * | 4/1996 | Fazio et al. | |
| 5,519,831 A * | 5/1996 | Holzhammer | |
| 5,541,886 A * | 7/1996 | Hasbun | |
| 5,600,677 A * | 2/1997 | Citta et al. | |
| 5,657,332 A * | 8/1997 | Auclair et al. | |
| 5,675,540 A * | 10/1997 | Roohparvar | |
| 5,682,352 A | 10/1997 | Wong et al. | |
| 5,696,717 A * | 12/1997 | Koh | |
| 5,726,649 A * | 3/1998 | Tamaru et al. | |
| 5,742,752 A * | 4/1998 | De Koening | |
| 5,751,637 A * | 5/1998 | Chen et al. | |
| 5,761,402 A * | 6/1998 | Kaneda et al. | |
| 5,801,985 A * | 9/1998 | Roohparvar et al. | |
| 5,838,832 A * | 11/1998 | Barnsley | |
| 5,860,106 A * | 1/1999 | Domen et al. | |
| 5,867,114 A | 2/1999 | Barbir | |
| 5,867,429 A * | 2/1999 | Chen et al. | |
| 5,877,986 A * | 3/1999 | Harari et al. | |
| 5,901,089 A * | 5/1999 | Korsh et al. | |
| 5,909,449 A * | 6/1999 | So et al. | |
| 5,912,906 A * | 6/1999 | Wu et al. | |
| 5,930,167 A * | 7/1999 | Lee et al. | |
| 5,937,424 A | 8/1999 | Leak et al. | |
| 5,942,004 A * | 8/1999 | Cappelletti | |
| 5,991,517 A * | 11/1999 | Harari et al. | |
| 5,995,417 A | 11/1999 | Chen et al. | |
| 6,009,014 A | 12/1999 | Hollmer et al. | |
| 6,034,891 A | 3/2000 | Norman | |
| 6,040,993 A | 3/2000 | Chen et al. | |
| 6,041,430 A | 3/2000 | Yamauchi | |
| 6,073,204 A | 6/2000 | Lakhani et al. | |
| 6,101,614 A | 8/2000 | Gonzales et al. | |
| 6,128,237 A | 10/2000 | Shirley et al. | |
| 6,134,140 A | 10/2000 | Tanaka et al. | |
| 6,134,143 A | 10/2000 | Norman | |
| 6,134,631 A | 10/2000 | Jennings | |
| 6,141,261 A | 10/2000 | Patti | |
| 6,166,962 A | 12/2000 | Chen et al. | |
| 6,178,466 B1 | 1/2001 | Gilbertson et al. | |
| 6,185,134 B1 | 2/2001 | Tanaka et al. | |
| 6,209,113 B1 | 3/2001 | Roohparvar | |
| 6,212,654 B1 | 4/2001 | Lou et al. | |
| 6,219,276 B1 | 4/2001 | Parker | |
| 6,219,447 B1 | 4/2001 | Lee et al. | |
| 6,222,762 B1 | 4/2001 | Guterman et al. | |
| 6,230,233 B1 | 5/2001 | Lofgren et al. | |
| 6,240,458 B1 | 5/2001 | Gilbertson | |
| 6,275,419 B1 | 8/2001 | Guterman et al. | |
| 6,279,069 B1 | 8/2001 | Robinson et al. | |
| 6,288,944 B1 | 9/2001 | Kawamura | |
| 6,292,394 B1 | 9/2001 | Cohen et al. | |
| 6,301,151 B1 | 10/2001 | Engh et al. | |
| 6,304,486 B1 | 10/2001 | Yano | |
| 6,307,776 B1 | 10/2001 | So et al. | |
| 6,317,363 B1 | 11/2001 | Guterman et al. | |
| 6,317,364 B1 | 11/2001 | Guterman et al. | |
| 6,345,004 B1 | 2/2002 | Omura et al. | |
| 6,360,346 B1 | 3/2002 | Miyauchi et al. | |
| 6,363,008 B1 | 3/2002 | Wong | |
| 6,363,454 B1 | 3/2002 | Lakhani et al. | |
| 6,366,496 B1 | 4/2002 | Torelli et al. | |
| 6,396,742 B1 | 5/2002 | Korsh et al. | |
| 6,397,364 B1 | 5/2002 | Barkan | |
| 6,405,323 B1 | 6/2002 | Lin et al. | |
| 6,418,060 B1 | 7/2002 | Yang et al. | |
| 6,442,585 B1 | 8/2002 | Dean et al. | |
| 6,456,528 B1 | 9/2002 | Chen | |
| 6,466,476 B1 | 10/2002 | Wong et al. | |
| 6,467,062 B1 | 10/2002 | Barkan | |
| 6,469,931 B1 | 10/2002 | Ban et al. | |
| 6,522,580 B2 | 2/2003 | Chen et al. | |
| 6,525,952 B2 | 2/2003 | Araki et al. | |
| 6,532,556 B1 | 3/2003 | Wong et al. | |
| 6,538,922 B1 | 3/2003 | Khalid et al. | |
| 6,558,967 B1 | 5/2003 | Wong | |
| 6,560,152 B1 | 5/2003 | Cernea | |
| 6,577,539 B2 | 6/2003 | Iwahashi | |
| 6,584,012 B2 | 6/2003 | Banks | |
| 6,615,307 B1 | 9/2003 | Roohparvar | |
| 6,621,739 B2 | 9/2003 | Gonzalez et al. | |
| 6,643,169 B2 | 11/2003 | Rudelic et al. | |
| 6,678,192 B2 | 1/2004 | Gongwer et al. | |
| 6,687,155 B2 | 2/2004 | Nagasue | |
| 6,707,748 B2 | 3/2004 | Lin et al. | |
| 6,708,257 B2 | 3/2004 | Bao | |
| 6,717,847 B2 | 4/2004 | Chen | |
| 6,731,557 B2 | 5/2004 | Beretta | |
| 6,738,293 B1 | 5/2004 | Iwahashi | |
| 6,751,766 B2 | 6/2004 | Guterman et al. | |
| 6,757,193 B2 | 6/2004 | Chen et al. | |
| 6,774,808 B1 | 8/2004 | Hibbs et al. | |
| 6,781,877 B2 | 8/2004 | Cernea et al. | |
| 6,807,095 B2 | 10/2004 | Chen et al. | |
| 6,809,964 B2 | 10/2004 | Moschopoulos et al. | |
| 6,829,167 B2 | 12/2004 | Tu et al. | |
| 6,845,052 B1 | 1/2005 | Ho et al. | |
| 6,851,018 B2 | 2/2005 | Wyatt et al. | |
| 6,856,546 B2 | 2/2005 | Guterman et al. | |
| 6,862,218 B2 | 3/2005 | Guterman et al. | |
| 6,870,767 B2 | 3/2005 | Rudelic et al. | |
| 6,894,926 B2 | 5/2005 | Guterman et al. | |
| 6,907,497 B2 | 6/2005 | Hosono et al. | |
| 6,930,925 B2 | 8/2005 | Guo et al. | |
| 6,934,188 B2 | 8/2005 | Roohparvar | |
| 6,937,511 B2 | 8/2005 | Hsu et al. | |
| 6,963,505 B2 | 11/2005 | Cohen | |
| 6,972,993 B2 | 12/2005 | Conley et al. | |
| 6,988,175 B2 | 1/2006 | Lasser | |
| 6,992,932 B2 | 1/2006 | Cohen | |
| 7,002,843 B2 | 2/2006 | Guterman et al. | |
| 7,012,835 B2 | 3/2006 | Gonzalez et al. | |
| 7,020,017 B2 | 3/2006 | Chen et al. | |
| 7,023,735 B2 | 4/2006 | Ban et al. | |
| 7,031,210 B2 | 4/2006 | Park et al. | |
| 7,031,214 B2 | 4/2006 | Tran | |
| 7,031,216 B2 | 4/2006 | You | |
| 7,039,846 B2 | 5/2006 | Hewitt et al. | |
| 7,042,766 B1 | 5/2006 | Wang et al. | |
| 7,054,193 B1 | 5/2006 | Wong | |
| 7,054,199 B2 | 5/2006 | Lee et al. | |
| 7,057,958 B2 | 6/2006 | So et al. | |
| 7,065,147 B2 | 6/2006 | Ophir et al. | |
| 7,068,539 B2 | 6/2006 | Guterman et al. | |
| 7,079,555 B2 | 7/2006 | Baydar et al. | |
| 7,088,615 B2 | 8/2006 | Guterman et al. | |
| 7,099,194 B2 | 8/2006 | Tu et al. | |
| 7,102,924 B2 | 9/2006 | Chen et al. | |
| 7,113,432 B2 | 9/2006 | Mokhlesi | |
| 7,130,210 B2 | 10/2006 | Bathul et al. | |
| 7,139,192 B1 | 11/2006 | Wong | |
| 7,139,198 B2 | 11/2006 | Guterman et al. | |
| 7,151,692 B2 | 12/2006 | Wu | |
| 7,170,802 B2 | 1/2007 | Cernea et al. | |
| 7,173,859 B2 | 2/2007 | Hemink | |
| 7,177,184 B2 | 2/2007 | Chen | |
| 7,177,195 B2 | 2/2007 | Gonzales et al. | |
| 7,177,199 B2 | 2/2007 | Chen et al. | |
| 7,177,200 B2 | 2/2007 | Ronen et al. | |
| 7,184,338 B2 | 2/2007 | Nakagawa et al. | |
| 7,187,195 B2 | 3/2007 | Kim | |
| 7,187,592 B2 | 3/2007 | Guterman et al. | |
| 7,190,614 B2 | 3/2007 | Wu | |
| 7,193,898 B2 | 3/2007 | Cernea | |
| 7,193,921 B2 | 3/2007 | Choi et al. | |
| 7,196,928 B2 | 3/2007 | Chen | |
| 7,197,594 B2 | 3/2007 | Raz et al. | |
| 7,200,062 B2 | 4/2007 | Kinsely et al. | |
| 7,221,592 B2 | 5/2007 | Nazarian | |
| 7,224,613 B2 | 5/2007 | Chen et al. | |
| 7,231,474 B1 | 6/2007 | Helms et al. | |
| 7,231,562 B2 | 6/2007 | Ohlhoff et al. | |
| 7,243,275 B2 | 7/2007 | Gongwer et al. | |

| Patent | Date | Inventor |
|---|---|---|
| 7,254,690 B2 | 8/2007 | Rao |
| 7,257,027 B2 | 8/2007 | Park |
| 7,259,987 B2 | 8/2007 | Chen et al. |
| 7,266,026 B2 | 9/2007 | Gongwer et al. |
| 7,274,611 B2 | 9/2007 | Roohparvar |
| 7,277,355 B2 | 10/2007 | Tanzana |
| 7,280,398 B1 | 10/2007 | Lee et al. |
| 7,280,409 B2 | 10/2007 | Misumi et al. |
| 7,289,344 B2 | 10/2007 | Chen |
| 7,301,807 B2 | 11/2007 | Khalid et al. |
| 7,301,817 B2 | 11/2007 | Li et al. |
| 7,308,525 B2 | 12/2007 | Lasser et al. |
| 7,310,255 B2 | 12/2007 | Chan |
| 7,310,272 B1 | 12/2007 | Mokhlesi et al. |
| 7,310,347 B2 | 12/2007 | Lasser |
| 7,321,509 B2 | 1/2008 | Chen et al. |
| 7,342,831 B2 | 3/2008 | Mokhlesi et al. |
| 7,345,928 B2 | 3/2008 | Li |
| 7,349,263 B2 | 3/2008 | Kim et al. |
| 7,356,755 B2 | 4/2008 | Fackenthal |
| 7,363,420 B2 | 4/2008 | Lin et al. |
| 7,397,697 B2 | 7/2008 | So et al. |
| 7,408,804 B2 | 8/2008 | Hemink et al. |
| 7,409,473 B2 | 8/2008 | Conley et al. |
| 7,420,847 B2 | 9/2008 | Li |
| 7,433,231 B2 | 10/2008 | Aritome |
| 7,437,498 B2 | 10/2008 | Ronen |
| 7,440,324 B2 | 10/2008 | Mokhlesi |
| 7,441,067 B2 | 10/2008 | Gorobetz et al. |
| 7,453,737 B2 | 11/2008 | Ha |
| 7,460,410 B2 | 12/2008 | Nagai et al. |
| 7,460,412 B2 | 12/2008 | Lee et al. |
| 7,466,592 B2 | 12/2008 | Mitani et al. |
| 7,468,911 B2 | 12/2008 | Lutze et al. |
| 7,471,581 B2 | 12/2008 | Tran et al. |
| 7,492,641 B2 | 2/2009 | Hosono et al. |
| 7,508,710 B2 | 3/2009 | Mokhlesi |
| 7,539,062 B2 | 5/2009 | Doyle |
| 7,551,492 B2 | 6/2009 | Kim |
| 7,570,520 B2 | 8/2009 | Kamei et al. |
| 7,593,259 B2 | 9/2009 | Kim et al. |
| 7,596,707 B1 | 9/2009 | Vemula |
| 7,631,245 B2 | 12/2009 | Lasser |
| 7,633,802 B2 | 12/2009 | Mokhlesi |
| 7,656,734 B2 | 2/2010 | Thorp et al. |
| 7,660,158 B2 | 2/2010 | Aritome |
| 7,660,183 B2 | 2/2010 | Ware et al. |
| 7,742,351 B2 | 6/2010 | Inoue et al. |
| 7,885,119 B2 | 2/2011 | Li |
| 2001/0002172 A1 | 5/2001 | Tanaka et al. |
| 2001/0006479 A1 | 7/2001 | Ikehashi et al. |
| 2002/0038440 A1 | 3/2002 | Barkan |
| 2002/0118574 A1 | 8/2002 | Gongwer et al. |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0103400 A1 | 6/2003 | Van Tran |
| 2003/0161183 A1 | 8/2003 | Van Tran |
| 2003/0189856 A1 | 10/2003 | Cho et al. |
| 2004/0057265 A1 | 3/2004 | Mirabel et al. |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2005/0007802 A1 | 1/2005 | Gerpheide |
| 2005/0013165 A1 | 1/2005 | Ban |
| 2005/0024941 A1 | 2/2005 | Lasser et al. |
| 2005/0024978 A1 | 2/2005 | Ronen |
| 2005/0086574 A1 | 4/2005 | Fackenthal |
| 2005/0121436 A1 | 6/2005 | Kamitani et al. |
| 2005/0157555 A1 | 7/2005 | Ono et al. |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1 | 10/2005 | Iyer et al. |
| 2005/0243626 A1 | 11/2005 | Ronen |
| 2006/0004952 A1 | 1/2006 | Lasser |
| 2006/0028875 A1 | 2/2006 | Avraham et al. |
| 2006/0028877 A1 | 2/2006 | Meir |
| 2006/0101193 A1 | 5/2006 | Murin |
| 2006/0107136 A1 | 5/2006 | Gongwer et al. |
| 2006/0129750 A1 | 6/2006 | Lee et al. |
| 2006/0133141 A1 | 6/2006 | Gorobets |
| 2006/0156189 A1 | 7/2006 | Tomlin |
| 2006/0179334 A1 | 8/2006 | Brittain et al. |
| 2006/0203546 A1 | 9/2006 | Lasser |
| 2006/0218359 A1 | 9/2006 | Sanders et al. |
| 2006/0221705 A1 | 10/2006 | Hemink et al. |
| 2006/0221714 A1 | 10/2006 | Li et al. |
| 2006/0239077 A1 | 10/2006 | Park et al. |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 | 1/2007 | Moshayedi et al. |
| 2007/0019481 A1 | 1/2007 | Park |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0067667 A1 | 3/2007 | Ikeuchi et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1 | 4/2007 | Lasser et al. |
| 2007/0091694 A1 | 4/2007 | Lee et al. |
| 2007/0103978 A1 | 5/2007 | Conley et al. |
| 2007/0103986 A1 | 5/2007 | Chen |
| 2007/0109845 A1 | 5/2007 | Chen |
| 2007/0109849 A1 | 5/2007 | Chen |
| 2007/0118713 A1 | 5/2007 | Guterman et al. |
| 2007/0143378 A1 | 6/2007 | Gorobetz |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |
| 2007/0171714 A1 | 7/2007 | Wu et al. |
| 2007/0183210 A1 | 8/2007 | Choi et al. |
| 2007/0189073 A1 | 8/2007 | Aritome |
| 2007/0195602 A1 | 8/2007 | Fong et al. |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0266232 A1 | 11/2007 | Rodgers et al. |
| 2007/0271424 A1 | 11/2007 | Lee et al. |
| 2007/0280000 A1 | 12/2007 | Fujiu et al. |
| 2007/0291571 A1 | 12/2007 | Balasundaram |
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0052446 A1 | 2/2008 | Lasser et al. |
| 2008/0055993 A1 | 3/2008 | Lee |
| 2008/0080243 A1 | 4/2008 | Edahiro et al. |
| 2008/0082730 A1 | 4/2008 | Kim et al. |
| 2008/0089123 A1 * | 4/2008 | Chae et al. ............... 365/185.03 |
| 2008/0104309 A1 | 5/2008 | Cheon et al. |
| 2008/0104312 A1 | 5/2008 | Lasser |
| 2008/0109590 A1 | 5/2008 | Jung et al. |
| 2008/0115017 A1 | 5/2008 | Jacobson |
| 2008/0123420 A1 | 5/2008 | Brandman et al. |
| 2008/0126686 A1 | 5/2008 | Sokolov et al. |
| 2008/0130341 A1 | 6/2008 | Shalvi et al. |
| 2008/0148115 A1 | 6/2008 | Sokolov et al. |

| | | | |
|---|---|---|---|
| 2008/0151618 A1 | 6/2008 | Sharon et al. | |
| 2008/0151667 A1 | 6/2008 | Miu et al. | |
| 2008/0158958 A1 | 7/2008 | Sokolov et al. | |
| 2008/0181001 A1 | 7/2008 | Shalvi | |
| 2008/0198650 A1 | 8/2008 | Shalvi et al. | |
| 2008/0209116 A1 | 8/2008 | Caulkins | |
| 2008/0209304 A1 | 8/2008 | Winarski et al. | |
| 2008/0215798 A1 | 9/2008 | Sharon et al. | |
| 2008/0219050 A1 | 9/2008 | Shalvi et al. | |
| 2008/0239093 A1 | 10/2008 | Easwar et al. | |
| 2008/0239812 A1 | 10/2008 | Abiko et al. | |
| 2008/0263262 A1 | 10/2008 | Sokolov et al. | |
| 2008/0282106 A1 | 11/2008 | Shalvi et al. | |
| 2009/0024905 A1 | 1/2009 | Shalvi et al. | |
| 2009/0034337 A1 | 2/2009 | Aritome | |
| 2009/0043831 A1 | 2/2009 | Antonopoulos et al. | |
| 2009/0043951 A1 | 2/2009 | Shalvi et al. | |
| 2009/0049234 A1 | 2/2009 | Oh et al. | |
| 2009/0073762 A1* | 3/2009 | Lee et al. | 365/185.03 |
| 2009/0086542 A1 | 4/2009 | Lee et al. | |
| 2009/0089484 A1 | 4/2009 | Chu | |
| 2009/0091979 A1 | 4/2009 | Shalvi | |
| 2009/0094930 A1 | 4/2009 | Schwoerer | |
| 2009/0106485 A1 | 4/2009 | Anholt | |
| 2009/0112949 A1 | 4/2009 | Ergan et al. | |
| 2009/0132755 A1 | 5/2009 | Radke | |
| 2009/0144600 A1 | 6/2009 | Perlmutter et al. | |
| 2009/0150894 A1 | 6/2009 | Huang et al. | |
| 2009/0157964 A1 | 6/2009 | Kasorla et al. | |
| 2009/0158126 A1 | 6/2009 | Perlmutter et al. | |
| 2009/0168524 A1 | 7/2009 | Golov et al. | |
| 2009/0172257 A1 | 7/2009 | Prins et al. | |
| 2009/0172261 A1 | 7/2009 | Prins et al. | |
| 2009/0199074 A1 | 8/2009 | Sommer et al. | |
| 2009/0204824 A1 | 8/2009 | Lin et al. | |
| 2009/0204872 A1 | 8/2009 | Yu et al. | |
| 2009/0213653 A1 | 8/2009 | Perlmutter et al. | |
| 2009/0213654 A1 | 8/2009 | Perlmutter et al. | |
| 2009/0225595 A1 | 9/2009 | Kim | |
| 2009/0228761 A1 | 9/2009 | Perlmutter et al. | |
| 2009/0240872 A1 | 9/2009 | Perlmutter et al. | |
| 2009/0300227 A1 | 12/2009 | Nochimowski et al. | |
| 2009/0323412 A1 | 12/2009 | Mokhlesi et al. | |
| 2009/0327608 A1 | 12/2009 | Eschmann | |
| 2010/0017650 A1 | 1/2010 | Chin et al. | |
| 2010/0034022 A1 | 2/2010 | Dutta et al. | |
| 2010/0057976 A1 | 3/2010 | Lasser | |
| 2010/0061151 A1 | 3/2010 | Miwa et al. | |
| 2010/0142277 A1 | 6/2010 | Yang et al. | |

FOREIGN PATENT DOCUMENTS

| | | |
|---|---|---|
| EP | 1434236 B1 | 6/2004 |
| EP | 1605509 A1 | 12/2005 |
| WO | 9610256 A1 | 4/1996 |
| WO | 9828745 A1 | 7/1998 |
| WO | 2002100112 A1 | 12/2002 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132457 A2 | 11/2007 |
| WO | 2007132458 A2 | 11/2007 |
| WO | 2007146010 A2 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009038961 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009063450 A2 | 5/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |
| WO | 2009095902 A2 | 8/2009 |

OTHER PUBLICATIONS

Takeuchi et al., "A Multipage Cell Architecture for High-Speed Programming Multilevel NAND Flash Memories", IEEE Journal of Solid State Circuits, vol. 33, No. 8, Aug. 1998.

JEDEC Standard JESD84-C44, "Embedded MultiMediaCard (e•MMC) Mechanical Standard, with Optional Reset Signal", Jedec Solid State Technology Association, USA, Jul. 2009.

JEDEC, "UFS Specification", version 0.1, Nov. 11, 2009.

SD Group and SD Card Association, "SD Specifications Part 1 Physical Layer Specification", version 3.01, draft 1.00, Nov. 9, 2009.

COMPAQ et al., "Universal Serial Bus Specification", revision 2.0, Apr. 27, 2000.

Serial ATA International Organization, "Serial ATA Revision 3.0 Specification", Jun. 2, 2009.

Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.

Huffman, A., "Non-Volatile Memory Host Controller Interface (NVMHCI)", Specification 1.0, Apr. 14, 2008.

Panchbhai et al., "Improving Reliability of NAND Based Flash Memory Using Hybrid SLC/MLC Device", Project Proposal for CSci 8980—Advanced Storage Systems, University of Minnesota, USA, Spring 2009.

U.S. Appl. No. 11/957,970 Official Action dated May 20, 2010.

Shalvi et al., U.S. Appl. No. 12/822,207 "Adaptive Over-Provisioning in Memory Systems" filed on Jun. 24, 2010.

Agrell et al., "Closest Point Search in Lattices", IEEE Transactions on Information Theory, vol. 48, No. 8, pp. 2201-2214, Aug. 2002.

Bez et al., "Introduction to Flash memory", Proceedings of the IEEE, vol. 91, No. 4, pp. 489-502, Apr. 2003.

Blahut, R.E., "Theory and Practice of Error Control Codes," Addison-Wesley, May, 1984, section 3.2, pp. 47-48.

Chang, L., "Hybrid Solid State Disks: Combining Heterogeneous NAND Flash in Large SSDs", ASPDAC, Jan. 2008.

Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.

Databahn™, "Flash memory controller IP", Denali Software, Inc., 1994 https://www.denali.com/en/products/databahn_flash.jsp.

DATALIGHT, Inc., "FlashFX Pro 3.1 High Performance Flash Manager for Rapid Development of Reliable Products", Nov. 16, 2006.

Duann, N., Silicon Motion Presentation "SLC & MLC Hybrid", Flash Memory Summit, Santa Clara, USA, Aug. 2008.

Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.

Eitan et al., "Multilevel Flash Cells and their Trade-Offs", Proceedings of the 1996 IEEE International Electron Devices Meeting (IEDM), pp. 169-172, New York, USA 1996.

Engh et al., "A self adaptive programming method with 5 mV accuracy for multi-level storage in FLASH", pp. 115-118, Proceedings of the IEEE 2002 Custom Integrated Circuits Conference, May 12-15, 2002.

Goodman et al., "On-Chip ECC for Multi-Level Random Access Memories," Proceedings of the IEEE/CAM Information Theory Workshop, Ithaca, USA, Jun. 25-29, 1989.

Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.

Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.

Horstein, "On the Design of Signals for Sequential and Nonsequential Detection Systems with Feedback," IEEE Transactions on Information Theory IT-12:4 (Oct. 1966), pp. 448-455.

Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.

Kawaguchi et al. 1995. A flash-memory based file system. In Proceedings of the USENIX 1995 Technical Conference, New Orleans, Louisiana. 155-164.

Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.

Lee et al., "Effects of Floating Gate Interference on NAND Flash Memory Cell Operation", IEEE Electron Device Letters, vol. 23, No. 5, pp. 264-266, May 2002.

Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.

Mielke et al., "Recovery Effects in the Distributed Cycling of Flash Memories", IEEE 44th Annual International Reliability Physics Symposium, pp. 29-35, San Jose, USA, Mar. 2006.

ONFI, "Open NAND Flash Interface Specification," revision 1.0, Dec. 28, 2006.

Phison Electronics Corporation, "PS8000 Controller Specification (for SD Card)", revision 1.2, Document No. S-07018, Mar. 28, 2007.

Shalvi, et al., "Signal Codes," Proceedings of the 2003 IEEE Information Theory Workshop (ITW'2003), Paris, France, Mar. 31-Apr. 4, 2003.

Shiozaki, A., "Adaptive Type-II Hybrid Broadcast ARQ System", IEEE Transactions on Communications, vol. 44, Issue 4, pp. 420-422, Apr. 1996.

Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.

ST Microelectronics, "Bad Block Management in NAND Flash Memories", Application note AN-1819, Geneva, Switzerland, May, 2004.

ST Microelectronics, "Wear Leveling in Single Level Cell NAND Flash Memories," Application note AN-1822 Geneva, Switzerland, Feb. 2007.

Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.

Wu et al., "eNVy: A non-Volatile, Main Memory Storage System", Proceedings of the 6th International Conference on Architectural support for programming languages and operating systems, pp. 86-87, San Jose, USA, 1994.

International Application PCT/IL2007/000575 Patentability report dated Mar. 26, 2009.

International Application PCT/IL2007/000575 Search Report dated May 30, 2008.

International Application PCT/IL2007/000576 Patentability Report dated Mar. 19, 2009.

International Application PCT/IL2007/000576 Search Report dated Jul. 7, 2008.

International Application PCT/IL2007/000579 Patentability report dated Mar. 10, 2009.

International Application PCT/IL2007/000579 Search report dated Jul. 3, 2008.

International Application PCT/IL2007/000580 Patentability Report dated Mar. 10, 2009.

International Application PCT/IL2007/000580 Search Report dated Sep. 11, 2008.

International Application PCT/IL2007/000581 Patentability Report dated Mar. 26, 2009.

International Application PCT/IL2007/000581 Search Report dated Aug. 25, 2008.

International Application PCT/IL2007/001059 Patentability report dated Apr. 19, 2009.

International Application PCT/IL2007/001059 Search report dated Aug. 7, 2008.

International Application PCT/IL2007/001315 search report dated Aug. 7, 2008.

International Application PCT/IL2007/001315 Patentability Report dated May 5, 2009.

International Application PCT/IL2007/001316 Search report dated Jul. 22, 2008.

International Application PCT/IL2007/001316 Patentability Report dated May 5, 2009.

International Application PCT/IL2007/001488 Search report dated Jun. 20, 2008.

International Application PCT/IL2008/000329 Search report dated Nov. 25, 2008.

International Application PCT/IL2008/000519 Search report dated Nov. 20, 2008.

International Application PCT/IL2008/001188 Search Report dated Jan. 28, 2009.

International Application PCT/IL2008/001356 Search Report dated Feb. 3, 2009.

International Application PCT/IL2008/001446 Search report dated Feb. 20, 2009.

U.S. Appl. No. 11/949,135 Official Action dated Oct. 2, 2009.

Sommer, N., U.S. Appl. No. 12/171,797 "Memory Device with Non-Uniform Programming Levels" filed on Jul. 11, 2008.

Shalvi et al., U.S. Appl. No. 12/251,471 "Compensation for Voltage Drifts in Analog Memory Cells" filed on Oct. 15, 2008.

U.S. Appl. No. 12/880,101 "Reuse of Host Hibernation Storage Space by Memory Controller", filed on Sep. 12, 2010.

U.S. Appl. No. 12/890,724 "Error Correction Coding Over Multiple Memory Pages", filed on Sep. 27, 2010.

U.S. Appl. No. 12/171,797 Official Action dated Aug. 25, 2010.

Numonyx, "M25PE16: 16-Mbit, page-erasable serial flash memory with byte-alterability, 75 MHz SPI bus, standard pinout", Apr. 2008.

U.S. Appl. No. 11/995,801 Official Action dated Oct. 15, 2010.

Hong et al., "NAND Flash-based Disk Cache Using SLC/MLC Combined Flash Memory", 2010 International Workshop on Storage Network Architecture and Parallel I/Os, pp. 21-30, USA, May 3, 2010.

U.S. Appl. No. 11/945,575 Official Action dated Aug. 24, 2010.

U.S. Appl. No. 12/045,520 Official Action dated Nov. 16, 2010.

U.S. Appl. No. 11/995,814 Official Action dated Dec. 17, 2010.

U.S. Appl. No. 12/388,528 Official Action dated Nov. 29, 2010.

U.S. Appl. No. 12/251,471 Official Action dated Jan. 3, 2011.

Engineering Windows 7, "Support and Q&A for Solid-State Drives", e7blog, May 5, 2009.

Micron Technology Inc., "Memory Management in NAND Flash Arrays", Technical Note, year 2005.

Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.

Park et al., "Sub-Grouped Superblock Management for High-Performance Flash Storages", IEICE Electronics Express, vol. 6, No. 6, pp. 297-303, Mar. 25, 2009.

"How to Resolve "Bad Super Block: Magic Number Wrong" in BSD", Free Online Articles Director Article Base, posted Sep. 5, 2009.

Ubuntu Forums, "Memory Stick Failed IO Superblock", posted Nov. 11, 2009.

Super User Forums, "SD Card Failure, can't read superblock", posted Aug. 8, 2010.

U.S. Appl. No. 12/987,174 filed on Jan. 10, 2011.

U.S. Appl. No. 12/987,175 filed on Jan. 10, 2011.

U.S. Appl. No. 12/963,649 filed on Dec. 9, 2010.

U.S. Appl. No. 13/021,754 filed on Feb. 6, 2011.

US 7,161,836, 01/2007, Wan et al. (withdrawn)

* cited by examiner

DATA STORAGE IN ANALOG MEMORY CELLS WITH PROTECTION AGAINST PROGRAMMING INTERRUPTION

CROSS-REFERENCE TO RELATED APPLICATIONS

This application claims the benefit of U.S. Provisional Patent Application 61/086,164, filed Aug. 5, 2008, U.S. Provisional Patent Application 61/086,541, filed Aug. 6, 2008, and U.S. Provisional Patent Application 61/093,461, filed Sep. 2, 2008, whose disclosures are incorporated herein by reference.

FIELD OF THE INVENTION

The present invention relates generally to memory devices, and particularly to methods and systems for protecting data stored in memory devices against programming interruption.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. This analog value represents the information stored in the cell. In Flash memories, for example, each analog memory cell holds a certain amount of electrical charge. The range of possible analog values is typically divided into intervals, each interval corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume two possible programming levels. Higher-density devices, often referred to as Multi-Level Cell (MLC) devices, store two or more bits per memory cell, i.e., can be programmed to assume more than two possible programming levels.

Several techniques are known in the art for protecting data stored in analog memory cell devices against power interruptions and programming failures. For example, U.S. Patent Application Publication 2007/0143531, whose disclosure is incorporated herein by reference, describes a method for power loss recovery for bit alterable memory. A bit alterable memory device includes status bits for a colony of memory cells. The state of each status bit may be changed depending on the programming state of the non-volatile bit alterable memory. The status bits are examined to determine the write status of two separate colonies of memory cells in the event of a power loss. The information gathered from the status bits is used by a power loss recovery mechanism to determine whether the data written to a plurality of memory cell colonies is partially written.

As another example, U.S. Pat. No. 6,988,175, whose disclosure is incorporated herein by reference, describes a method for managing page-based data storage media such as Flash media. New data are written to the storage medium in a manner that precludes corruption of old data if the writing of the new data is interrupted. Specifically, risk zones are defined by identifying, for each page, the other pages whose data are put at risk of corruption if writing to the page is interrupted. A page, which otherwise would be the target of a write operation, is not written if any of the pages in its risk zone contain data that could be corrupted if the write operation is interrupted.

U.S. Pat. No. 7,420,847, whose disclosure is incorporated herein by reference, describes a non-volatile memory device that is able to recover data in the event of a program failure without having to maintain a copy of the data until the write is completed. In some embodiments, the data is recovered by logically combining the verify data for the (failed) write process maintained in data latches with the results of one or more read operations to reconstitute the data.

SUMMARY OF THE INVENTION

An embodiment of the present invention provides a method for data storage, including:

storing first data in analog memory cells using a first programming operation, which writes to the memory cells respective analog values representing respective bit values of the first data; and storing in the analog memory cells second data in addition to the first data using a second programming operation, which modifies the respective analog values of the memory cells so as to represent bit value combinations of the first and second data, wherein the first and second programming operations are defined such that, at all times during the second programming operation, the analog value of each memory cell remains unambiguously indicative of the respective bit value of the first data stored in that memory cell.

In some embodiments, the first and second programming operations are defined such that the analog values that are potentially reached during the second programming operation by the memory cells that store a first bit value of the first data are contained in a first range, and the analog values that are potentially reached during the second programming operation by the memory cells that store a second bit value of the first data, different from the first bit value, are contained in a second range that does not overlap the first range.

In an embodiment, following an interruption in the second programming operation, the first data is reconstructed by reading the analog values from the memory cells using a read threshold positioned between the first and second ranges.

In a disclosed embodiment, storing the first and second data includes evaluating a condition with respect to the analog memory cells and, based on the condition, selecting to store the first and second data using one of a first version of the programming operations, in which at all times during the second programming operation the analog value of each memory cell remains unambiguously indicative of the respective bit value of the first data stored in that memory cell, and a second version of the programming operations that is different from the first version. In an embodiment, evaluating the condition includes assessing whether the first and second data originate from different data items. In another embodiment, evaluating the condition includes performing at least one action selected from a group of actions consisting of:

assessing a size of a data item to be stored in the analog memory cells;

identifying a pattern indicating an end of the data item to be stored in the analog memory cells; and assessing an elapsed time since a previous programming operation.

In still another embodiment, the condition is evaluated after the first data was stored using the second version and before storing the second data, and, upon selecting the first version, the analog values of at least some of the analog memory cells are adjusted to match the first version of the programming operations.

In an embodiment, the analog memory cells are included in a memory device, selection of the one of the first and second version is performed by circuitry that communicates with the memory device over an interface, and the selected version is reported to the memory device via the interface.

In some embodiments, the first programming operation represents a given bit value of the first data by analog values that are higher than the analog values representing the other bit value of the first data, and storing the second data includes applying the second programming operation to the memory cells holding the given bit value of the first data, and subsequently applying the second programming operation to the memory cells holding the other bit value of the first data.

There is additionally provided, in accordance with an embodiment of the present invention, a data storage apparatus, including:

a plurality of analog memory cells; and circuitry, which is configured to store first data in a group of the analog memory cells using a first programming operation, which writes to the memory cells respective analog values representing respective bit values of the first data, and to store in the group of the analog memory cells second data in addition to the first data using a second programming operation, which modifies the respective analog values of the memory cells so as to represent bit value combinations of the first and second data, wherein the first and second programming operations are defined such that, at all times during the second programming operation, the analog value of each memory cell in the group remains unambiguously indicative of the respective bit value of the first data stored in that memory cell.

There is also provided, in accordance with an embodiment of the present invention, a data storage apparatus, including:

an interface, which is operative to communicate with a memory device including a plurality of analog memory cells; and circuitry, which is configured to store first data in a group of the analog memory cells using a first programming operation, which writes to the memory cells respective analog values representing respective bit values of the first data, and to store in the group of the analog memory cells second data in addition to the first data using a second programming operation, which modifies the respective analog values of the memory cells so as to represent bit value combinations of the first and second data, wherein the first and second programming operations are defined such that, at all times during the second programming operation, the analog value of each memory cell in the group remains unambiguously indicative of the respective bit value of the first data stored in that memory cell.

The present invention will be more fully understood from the following detailed description of the embodiments thereof, taken together with the drawings in which:

DETAILED DESCRIPTION OF EMBODIMENTS

Overview

Figure 1:
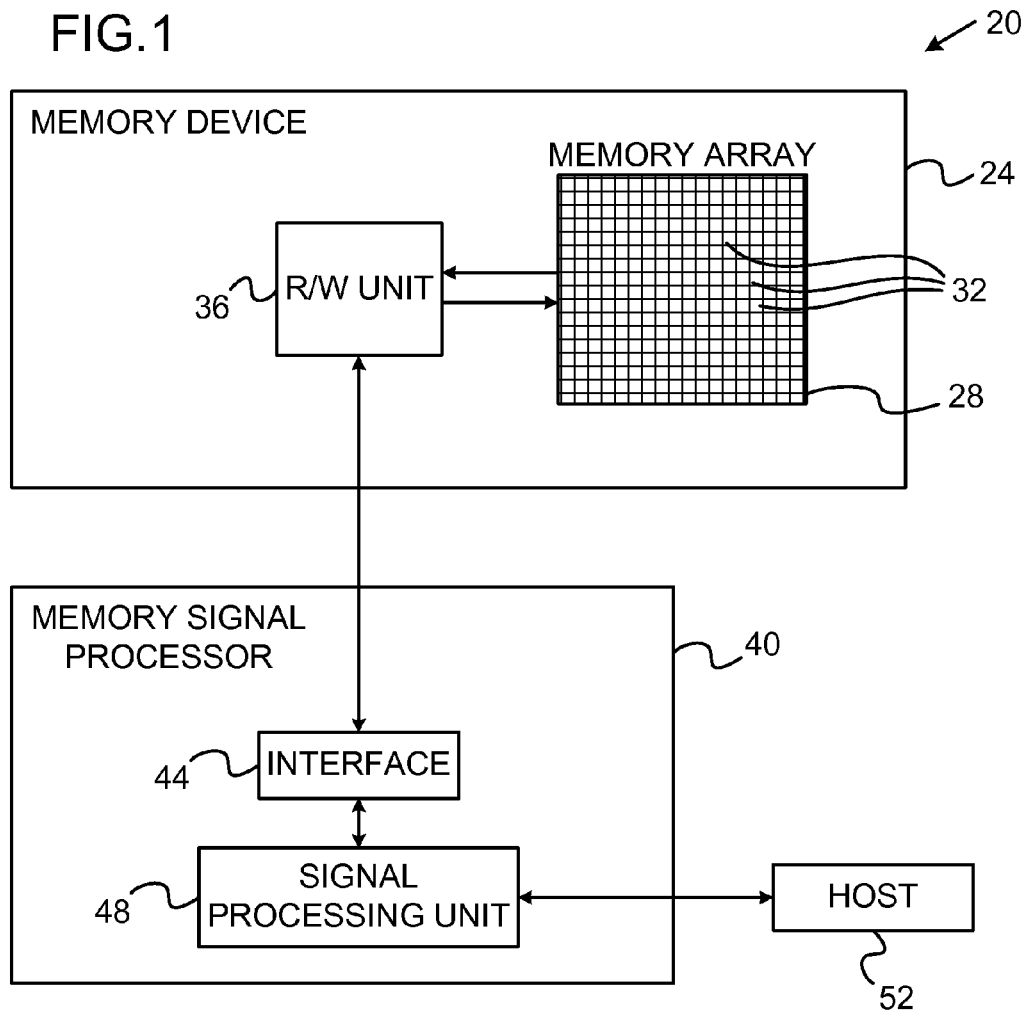
FIG. 1 is a block diagram that schematically illustrates a memory system, in accordance with an embodiment of the present invention.

Analog memory cell devices store data by programming the memory cells to assume certain programming levels that represent the data. If the programming operation is disrupted, such as due to power failure, the stored data may be lost or corrupted. Multi-Level Cell (MLC) devices, which store multiple data bits in each memory cell, are particularly sensitive to programming interruption.

In many practical cases, different bits in a given multi-level cell may belong to different data items and may be stored at different times. For example, a given data file may be stored in the Least Significant Bits (LSB) of a certain group of multi-level memory cells, and another file may be stored in the Most Significant Bits (MSB) of these memory cells at a later time. In known memory devices, if the MSB programming operation is interrupted, the analog values (e.g., threshold voltages) of the cells are distorted and this distortion usually corrupts both the LSB and MSB. While corruption of the currently-written data (the MSB) may be permissible in some applications, corruption of the LSB (which often belongs to another data item and may have been written at a much earlier time) is highly undesirable.

Embodiments of the present invention that are described hereinbelow provide improved methods and systems for storing data in multi-level analog memory cells. These methods and systems reduce the effects of programming interruptions by confining possible corruption to the currently-written data, and ensuring that data written to other bits of the memory cells in previous programming operations is not lost.

In some embodiments, a group of multi-level memory cells, e.g., a word line, is programmed using at least two programming operations. The first programming operation programs first bits of the memory cells (e.g., the LSBs). The second programming operation programs second bits of the memory cells (e.g., the MSBs) in addition to the first bits, i.e., after the first bits are already programmed. In other words, the second programming operation shifts the analog values of the memory cells from one constellation of programming levels to another. In a typical application, programming is performed using an iterative Program and Verify (P&V) sequence.

In the resilient programming schemes described herein, the programming operations are designed so that at any time during the second programming operation, the analog value of each memory cell remains unambiguously indicative of the first bit value stored in that memory cell. As a result, if the second programming operation is interrupted for any reason, the data stored in the first programming operation will still be recoverable.

In an example embodiment, the programming levels of a four-level Flash device are positioned such that, during the entire P&V sequence that programs the MSB, the threshold voltage of each memory cell remains in a range that is uniquely associated with the LSB value stored in that cell. If the MSB programming sequence is interrupted at any point in time, the threshold voltage of each memory cell at the time of interruption will fall in the range that corresponds to the correct LSB value. The LSB values can be recovered by positioning one or more read thresholds between the ranges.

Several examples of interruption-resilient programming schemes, as well as methods for designing programming operations that achieve such resilience, are described herein. In some embodiments, a resilient programming scheme is applied selectively, i.e., only to selected groups of memory cells. The decision whether or not to apply a resilient programming scheme may depend, for example, on whether different bits in the cell group in question store data from the same data item or from different data items.

Unlike some known protection schemes that copy and back-up the first data before the second data is programmed, the methods and systems described herein achieve resilience by appropriate positioning of the programming levels. Since the disclosed techniques do not need to copy or back-up data, they enable increased programming speed and reduced programming complexity in comparison with known solutions.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory device 24, which stores data in a memory cell array 28. The memory array comprises multiple analog memory cells 32. In the context of the present patent application and in the claims, the term "analog memory cell" is used to describe any memory cell that holds a continuous, analog value of a physical parameter, such as an electrical voltage or charge. Array 32 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells 32 into digital samples having a resolution of one or more bits. Data is typically written to and read from the memory cells in groups that are referred to as pages. In some embodiments, the R/W unit can erase a group of cells 32 by applying one or more negative erasure pulses to the cells.

The storage and retrieval of data in and out of memory device 24 is performed by a Memory Signal Processor (MSP) 40. MSP 40 comprises an interface 44 for communicating with memory device 24, and a signal processing unit 48, which processes the data that is written into and read from device 24. In some embodiments, unit 48 encodes the data for storage using a suitable Error Correction Code (ECC) and decodes the ECC of data retrieved from the memory. In some embodiments, unit 48 produces the storage values for storing in the memory cells and provides these values to R/W unit 36. Alternatively, unit 48 provides the data for storage, and the conversion to storage values is carried out by the R/W unit internally to the memory device. Alternatively to using an MSP, the methods described herein can be carried out by any suitable type of memory controller that applies ECC to the data.

MSP 40 communicates with a host 52, for accepting data for storage in the memory device and for outputting data retrieved from the memory device. MSP 40, and in particular unit 48, may be implemented in hardware. Alternatively, MSP 40 may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and MSP 40 are implemented as two separate Integrated Circuits (ICs). In alternative embodiments, however, the memory device and the MSP may be integrated on separate semiconductor dies in a single Multi-Chip Package (MCP) or System on Chip (SoC), and may be interconnected by an internal bus. Further alternatively, some or all of the MSP circuitry may reside on the same die on which the memory array is disposed. Further alternatively, some or all of the functionality of MSP 40 can be implemented in software and carried out by a processor or other element of the host system. In some embodiments, host 44 and MSP 40 may be fabricated on the same die, or on separate dies in the same device package.

Memory cells 32 of array 28 are typically arranged in a grid having multiple rows and columns. Each cell 32 typically comprises a floating gate Metal-Oxide Semiconductor (MOS) transistor. A certain amount of electrical charge (electrons or holes) can be stored in a particular cell by applying appropriate voltage levels to the transistor gate, source and drain. The value stored in the cell can be read by measuring the threshold voltage of the cell, which is defined as the minimal voltage that needs to be applied to the gate of the transistor in order to cause the transistor to conduct. The read threshold voltage is indicative of the charge stored in the cell.

In a typical configuration of array 28, the gates of the transistors in each row are connected by word lines, and the sources of the transistors in each column are connected by bit lines. The array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells. In a typical implementation, a two-bit-per-cell memory device may have four pages per row, a three-bit-per-cell memory device may have six pages per row, and a four-bit-per-cell memory device may have eight pages per row.

Erasing of cells is usually carried out in blocks that contain multiple pages. Typical memory devices may comprise several thousand erasure blocks. In a typical two-bit-per-cell MLC device, each erasure block is on the order of 32 word lines, each comprising several thousand cells. Each word line of such a device is often partitioned into four pages (odd/even order cells, least/most significant bit of the cells). Three-bit-per cell devices having 32 word lines per erasure block would have 192 pages per erasure block, and four-bit-per-cell devices would have 256 pages per block. Alternatively, other block sizes and configurations can also be used.

Some memory devices comprise two or more separate memory cell arrays, often referred to as planes. Since each plane has a certain "busy" period between successive write operations, data can be written alternately to the different planes in order to increase programming speed.

R/W unit 36 typically programs memory cells 32 using an iterative Program and Verify (P&V) process. In such a process, the R/W unit applies a sequence of programming pulses to a group of memory cells, e.g., to a certain word line in array 28. Following each programming iteration, the R/W unit compares the threshold voltages of the memory cells to one or more verification thresholds. Each verification threshold corresponds to a certain programming state of the cells, which represents a certain data value. A memory cell whose threshold voltage is higher than the applicable verification threshold is regarded as programmed successfully, i.e., as a cell that reached its intended programming level. In the next iteration, programming continues for only those cells that have not yet reached their intended threshold voltages, i.e., for the cells whose threshold voltages are smaller than the applicable verification thresholds.

Typically, the amplitude of the programming pulses increases from pulse to pulse. The average increase in the threshold voltage of the cells in response to a programming pulse is referred to herein as a program step size, or Increment Step Pulse Program (ISPP). As can be appreciated, after the P&V process is completed, the threshold voltages of the cells belonging to a certain programming level will be distributed over the interval [V, V+ISPP], wherein V denotes the verification threshold of the programming level. A small ISPP produces a relatively narrow threshold voltage distribution, at the expense of slower programming. A high ISPP produces wider distributions but faster programming. (Note that in practice, a small fraction of the cells may have threshold voltages that deviate slightly from the interval [V, V+ISPP]. In other words, the threshold voltage distribution of a given programming level may have residual "tails" slightly below V and/or slightly above V+ISPP.)

Figure 2:
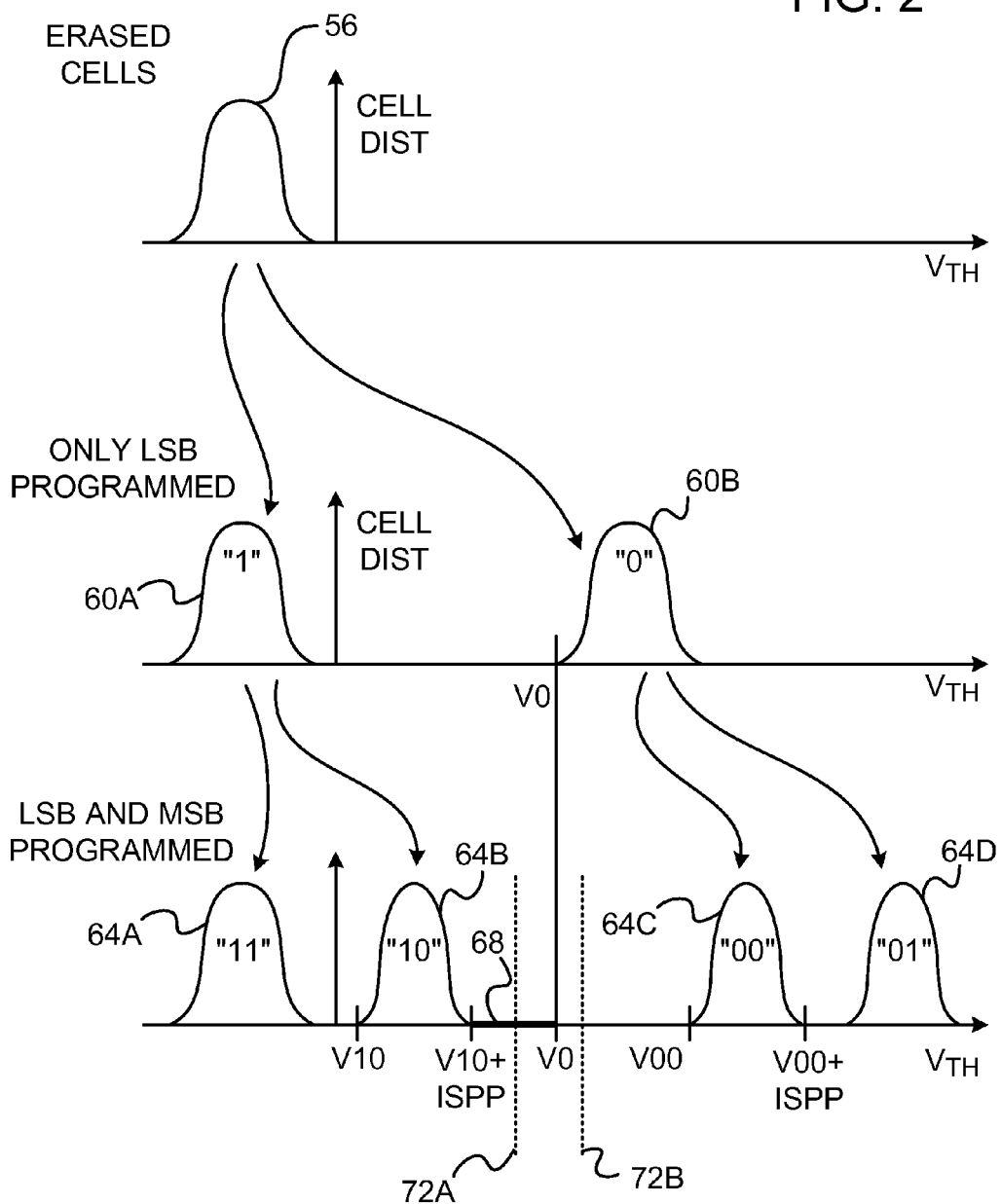
FIG. 2 is a diagram that schematically illustrates programming levels in a group of multi-level analog memory cells, in accordance with an embodiment of the present invention.

FIG. 2 is a diagram that schematically illustrates programming levels in a group of multi-level analog memory cells 32, in accordance with an embodiment of the present invention. The example of FIG. 2 refers to a group of four-level memory cells, e.g., the cells along a given word line, each storing two data bits. The two data bits in each memory cell are referred to as a Least Significant Bit (LSB) and a Most Significant Bit (MSB). This notation, however, is used purely as a way to refer to the different bits and does not imply any order of importance between them.

R/W unit 36 in device 24 stores data in these four-level memory cells using two types of programming operations. The first operation programs the LSBs of the cells. The second operation programs the MSBs of the cells after the LSBs have already been programmed. The programming operations modify the threshold voltages of the cells, so as to cause the threshold voltage of each cell to reach the level that represents the data to be stored therein.

A curve 56 at the top of FIG. 2 shows the distribution of threshold voltages of the memory cells before programming begins, i.e., when the cells are erased. Typically although not necessarily, erased cells are associated with negative threshold voltages.

The first programming operation programs the LSBs of the cells. The LSBs are programmed by applying programming pulses to the memory cells that are to store LSB="0". Memory cells that are to store LSB="1" are not programmed. After LSB programming, a curve 60A shows the threshold voltage distribution in the cells that store LSB="1", and a curve 60B shows the threshold voltage distribution in the cells that store LSB="0".

The second programming operation programs the MSBs of the cells, after the LSBs have already been programmed. After MSB programming, each cell assumes one of four possible programming levels, which represent the four possible LSB/MSB combinations. The threshold voltage distributions of the four programming levels are shown by curves 64A . . . 64D at the bottom of FIG. 2. As can be seen in the figure, a cell that stores LSB="1" and whose MSB="1" (distribution 64A) is not subjected to programming pulses in the MSB programming operation. A cell that stores LSB="1" and whose MSB="0" is subjected to programming pulses that move its threshold voltage from distribution 60A to distribution 64B. A cell that stores LSB="0" and whose MSB="0" is subjected to programming pulses that move its threshold voltage from distribution 60B to distribution 64C. A cell that stores LSB="0" and whose MSB="1" is subjected to programming pulses that move its threshold voltage from distribution 60B to distribution 64D.

The threshold voltage distribution of a given programming level depends on the verification threshold of that programming level, and on the programming step size (ISPP). For example, distribution 64B lies in the interval [V10, V10+ISPP]. Similarly, distribution 64C lies in the interval [V00, V00+ISPP].

Programming Level Design for Resilience Against Programming Interruptions

In some cases, the second programming operation (i.e., MSB programming) may be interrupted before it is completed. Programming interruption may be caused, for example, by a disruption of the electrical power supply to device 24, by hardware failure or for any other reason. Power loss to device 24 may occur, for example, when a user of a Disk-on-Key (DoK) device unplugs the device during active storage, or when a removable Solid State Disk (SSD) unit is removed during operation.

In such scenarios, it is highly desirable to prevent programming interruptions from corrupting the data stored in the LSBs of the cells, and to confine any possible corruption or data loss to the currently-programmed MSB data. This requirement is particularly important when the LSB data and MSB data belong to different data items, e.g., to different files.

In some embodiments of the present invention, the programming levels used in device 24 are positioned so as to prevent LSB corruption in the event of interruption of MSB programming. Positioning of the programming levels may involve setting of verification thresholds and/or ISPP values that are used in the LSB and MSB programming operations. In order to prevent MSB programming interruption from corrupting the LSB data, the programming levels in device 24 are designed to meet the following guideline: During the entire MSB programming sequence, the threshold voltage of each memory cell remains in an interval that is uniquely indicative of LSB bit value stored in that cell. In other words, if the MSB programming sequence is interrupted at any point in time, the threshold voltage of each memory cell at the time of interruption will be unambiguously indicative of the LSB bit value stored in that cell.

The above-mentioned condition will now be demonstrated with reference to the programming scheme of FIG. 2. In this example, the MSB programming interruption occurs when some of the memory cells may be in transition from distribution 60A to distribution 64B, some cells may be in transition from distribution 60B to distribution 64C, and other cells may be in transition from distribution 60B to distribution 64D. The exact threshold voltage of a given memory cell at the time of MSB programming interruption may be unknown, but is expected to be larger than its smallest possible initial value (the lower edge of the LSB distribution from which MSB programming started) and smaller than its largest possible final value (the upper edge of the intended MSB distribution).

Consider, for example, a cell that was initially programmed with LSB="0" and is in the process of programming with MSB="0", i.e., a cell that is transitioning from distribution 60B to distribution 64C. If the MSB programming of this cell is interrupted before completion, the threshold voltage of the cell is likely to lie somewhere between V0 (the lower edge of distribution 60B) and V00+ISPP (the higher edge of distribution 64C).

Note that in the scheme of FIG. 2, the threshold voltage of any memory cell whose LSB="0" remains in the interval $V_{TH}$>V0 during the entire MSB programming sequence, regardless of the intended MSB value. The threshold voltage of any memory cell whose LSB="1", on the other hand, remains in the interval $V_{TH}$<V10+ISPP during the entire MSB programming sequence, regardless of the intended MSB value. Since V10+ISPP<V0, the two intervals do not overlap.

In other words, if the threshold voltage of a given memory cell meets $V_{TH}$>V0 following MSP programming interruption, then the cell can be safely regarded as storing LSB="0". If the threshold voltage meets $V_{TH}$<V10+ISPP following the interruption, then the cell can be regarded as storing LSB="1". Thus, the LSB data values can be recovered from the memory cells even though their threshold voltages are distorted by the MSP programming interruption. As noted above, the position and width of the threshold voltage distributions of the different LSB and MSB programming levels are determined by the chosen values of the verification thresholds and ISPP. In some embodiments, R/W unit 36 sets these parameters, or any suitable subset of the parameters, to meet with the above-mentioned condition.

In some embodiments, following MSP programming interruption, R/W unit 36 retrieves the LSB data values from the memory cells by positioning a read threshold 72A in a region 68 (given by V10+ISPP<$V_{TH}$<V0), which differentiates between the two above-mentioned intervals. Unit 36 compares the threshold voltages of the memory cells to read threshold 72A. Cells whose threshold voltages are lower than read threshold 72A are regarded as storing LSB="1", and cells whose threshold voltages are higher than read threshold 72A are regarded as storing LSB="0". Thus, using the disclosed technique, the LSB data can be retrieved with high reliability even though the subsequent MSB programming operation was disrupted. In some embodiments, read threshold 72A is different from a normal read threshold 72B that would be used for LSB readout under normal conditions (i.e., with no interruption).

The design scheme described above can be generalized to other kinds of MLC, such as eight-level or sixteen-level cells. Consider, for example, a group of eight-level, 3 bits/cell MLC. The three bits stored in each cell are denoted LSB, Center Significant Bit (CSB) and MSB. In this example, mapping of bits to programming levels at the different programming stages is performed according to the following table (in increasing order of threshold voltage):

| Programming stage | Programming level order |
| --- | --- |
| After LSB programming | 1, 0 |
| After LSB + CSB programming | 11, 10, 00, 01 |
| After LSB + CSB + MSB programming | 111, 110, 100, 101, 001, 000, 010, 011 |

The ISPP values for programming the LSB, CSB and MSB are denoted ISPP1, ISPP2 and ISPP3, respectively. The verification threshold used for programming a given programming level x is denoted Vx (e.g., the verification threshold of level L10 is denoted V10).

R/W unit 36 may set suitable verification thresholds and ISPP values, which ensure that the data stored in the LSBs of the cells is still recoverable in the event of CSB programming interruption, and that CSB data is still recoverable in the event of MSB programming interruption. For example, setting V10+ISPP2<V0 ensures that the LSB data is not corrupted by CSB programming interruption. Setting V110+ISPP3<V10, V101+ISPP3<V00 and V000+ISPP3<V01 ensures that CSB data is not corrupted by MSB programming interruption. Similar conditions can be defined for sixteen-level, four bits/cell MLC, and for any other suitable type of MLC.

In an alternative embodiment, the above-mentioned constraints can be relaxed by splitting the second programming operation into stages that are carried out in succession. For example, in the four-level scheme of FIG. 2, the second programming operation can be split into the two following stages (the first programming operation is unchanged):

Program the cells in level 60B to level 64C or level 64D, depending on their MSB values.

Only after completing the previous step, program the cells in level 60A to level 64A or level 64B, depending on their MSB values.

When this order of operation is maintained, it is possible to reconstruct the LSB value of a given cell upon programming interruption at any given time, even if V10+ISPP>V00. This principle can be generalized in a straightforward manner to any other suitable MLC configuration, e.g., eight-level or sixteen-level cells.

In other words, when the first programming operation represents one bit value (e.g., LSB="0") using threshold voltages that are higher than the threshold voltages used for representing the other bit value (e.g., LSB="1"), the second programming operation can be split into successive stages:

Program the memory cells that were programmed by the first programming operation to the high threshold voltages.

Only after completing the previous step, program the memory cells that were programmed by the first programming operation to the low threshold voltages.

In some embodiments, the above-mentioned programming order is implemented internally to the memory device and is transparent to the memory controller or MSP. Alternatively, the MSP may program a page while causing the memory device to carry out this scheme, e.g., by sending appropriate subset masks of the page. This sort of programming, however, increases the number of write operations and may reduce programming speed.

The embodiments described herein are example embodiments, which were chosen purely for the sake of conceptual clarity. Any other suitable MLC programming scheme in which, during the entire duration of a given programming operation, the cell analog values remain unambiguously indicative of the previously-stored data, can also be used.

Selective Application of Resilient Programming Scheme

In some cases, applying the interruption-resilient programming schemes described above reduces the utilization of the available threshold voltage range of the memory cells, and may therefore degrade other performance aspects of the memory device (e.g., storage density, storage reliability or programming speed). In some embodiments, memory device 24 applies the resilient programming schemes only in selected groups of memory cells (e.g. selected word lines) in which data protection is of particular value or need. For example, R/W unit 36 may hold two alternative sets of verification thresholds and/or ISPP values. One set, which is referred to as a resilient set, is applied when protection against programming interruption is desired. The other set, which is referred to as a normal set, is applied otherwise, so as not to compromise performance unless necessary.

Memory device 24 or MSP 40 may apply any suitable criteria for deciding whether to program a given group of memory cells using the resilient or the normal programming scheme. The description that follows assumes that selection of the appropriate programming scheme is performed by the MSP. In these embodiments, the MSP and the memory device support a suitable command interface, using which the MSP instructs the memory device to apply the selected programming scheme. In alternative embodiments, however, the decision may be taken internally to the memory device, e.g., by unit 36.

Typically, the decision depends on whether the data stored in different MLC bits belongs to the same data item (e.g., a file) or to different data items. When different MLC bits store data belonging to the same data item, protecting some bits against programming interruption of other bits may be of little value. When different MLC bits store data from different data items, on the other hand, protection may be important.

Programming scheme selection may depend, for example, on the size of the data item to be programmed. This sort of criterion assumes that a large data item is likely to occupy multiple MLC bits (e.g., an entire word line or more). When the data item is relatively small, on the other hand, there is high likelihood that different bits in the word line will store data from a different data item. The size of the data item can sometimes be extracted from the write command sent to the memory device. For example, the Open NAND Flash Interface (ONFI) specifications define Block Abstracted (BA) programming commands, which specify the number of sectors to be programmed.

As another example, the MSP may identify data patterns that indicate the end of a data item (e.g., End-of-File indication or File Close command). As yet another example, the MSP may estimate or measure the time period that elapsed since the previous programming operation to the word line in question. A simpler scheme may estimate or measure the time that elapsed since the last programming operation to the entire block or to the entire memory device. A long elapsed time is likely to indicate that the next programming operation is associated with a different data item.

Further alternatively, the MSP may evaluate any other suitable condition to decide whether to apply the interruption-resilient programming scheme or a normal programming scheme to a given group of cells. Note that these decision criteria can be used for selectively applying any suitable protection method, and not necessarily the methods described herein.

Figure 3:
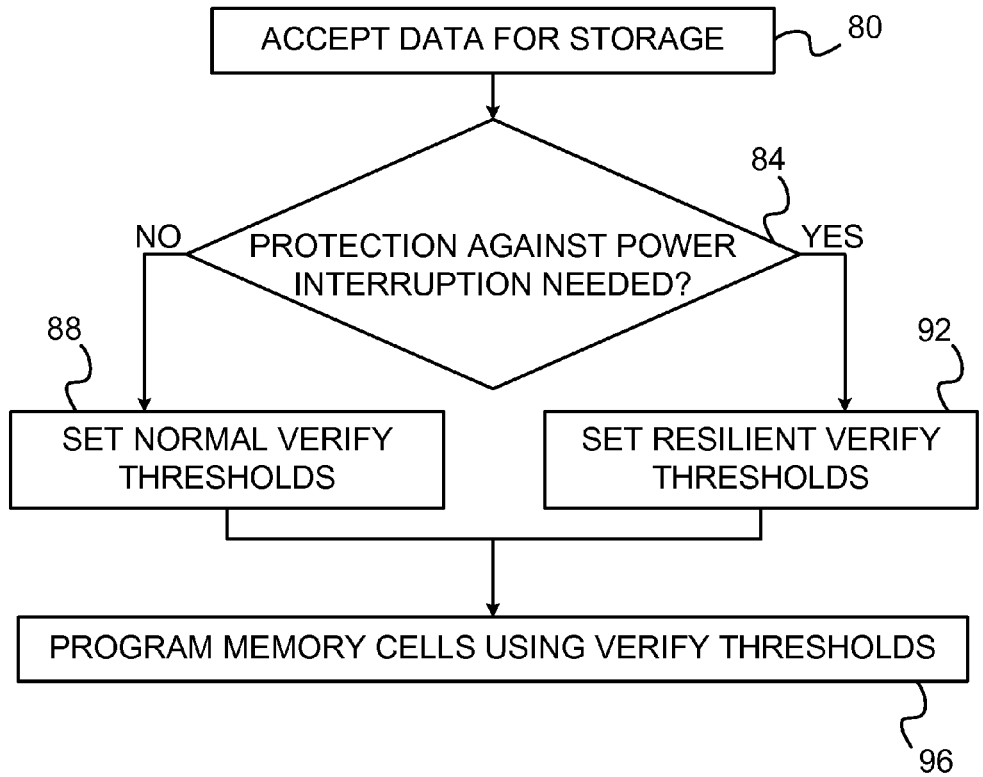
FIGS. 3 and 4 are flow charts that schematically illustrate methods for programming analog memory cells, in accordance with embodiments of the present invention.

FIG. 3 is a flow chart that schematically illustrates a method for programming analog memory cells 32, in accordance with an embodiment of the present invention. The method begins with MSP 40 accepting data for storage from host 52, at a data input step 80. The MSP checks whether protection against programming interruption is desired for this data, at a protection checking step 84. For example, the MSP may assess whether the word line in which this data is to be stored holds data from a single data item or from multiple data items, e.g., using the criteria described above.

If resilience against programming interruption is not necessary (e.g., if the MSP determines that the word line is likely to hold data from only a single data item), the MSP selects the normal programming scheme, at a normal selection step 88. Otherwise (e.g., if the word line is likely to hold data from multiple data items), the MSP selects a resilient programming scheme, at a resilient selection step 92. Unit 36 then applies the verification thresholds and/or ISPP values of the selected programming scheme, and programs the memory cells using the applied scheme, at a programming step 96.

The method of FIG. 3 assumes that the programming scheme selection is performed before beginning to program the word line in question. In some cases, however, the need to use a resilient programming scheme arises when the word line is already partially programmed, e.g., after LSB programming. This situation is typical, for example, when the decision is taken based on the elapsed time since the previous programming operation. In such cases, the MSP may switch to the resilient programming scheme at a later stage.

Figure 4:
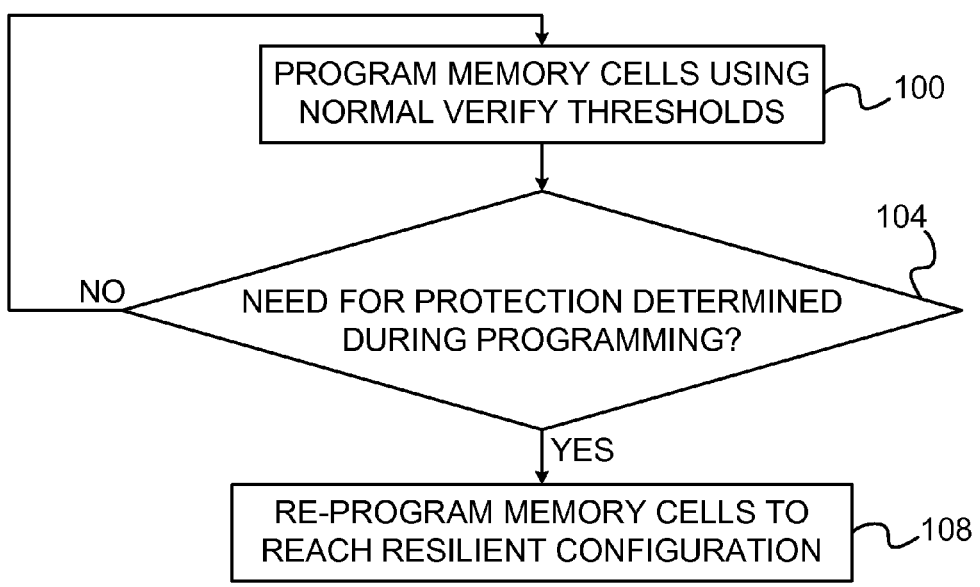

FIG. 4 is a flow chart that schematically illustrates a method for programming analog memory cells 32, in accordance with an embodiment of the present invention. The method begins with MSP 40 and memory device 24 programming the memory cells of a given word line using the normal programming scheme, at a normal writing step 100. At some stage, when the word line is partially programmed, the MSP checks whether it is desired to revert to the resilient programming scheme, at a resilience checking step 104. If no trigger to switch to the resilient scheme arises, the method loops back to step 100 above and programming continues using the normal scheme.

If, on the other hand, the MSP determines that subsequent programming should be performed using the resilient scheme, the MSP re-programs the memory cells to reach the programming levels of the resilient scheme, at a re-programming step 108. The re-programming operation typically adjusts the threshold voltages of the cells using slightly higher verification thresholds, so as to satisfy the above-described conditions that ensure resilience against programming interruption. From this stage, programming continues using the resilient programming scheme.

Figure 5:
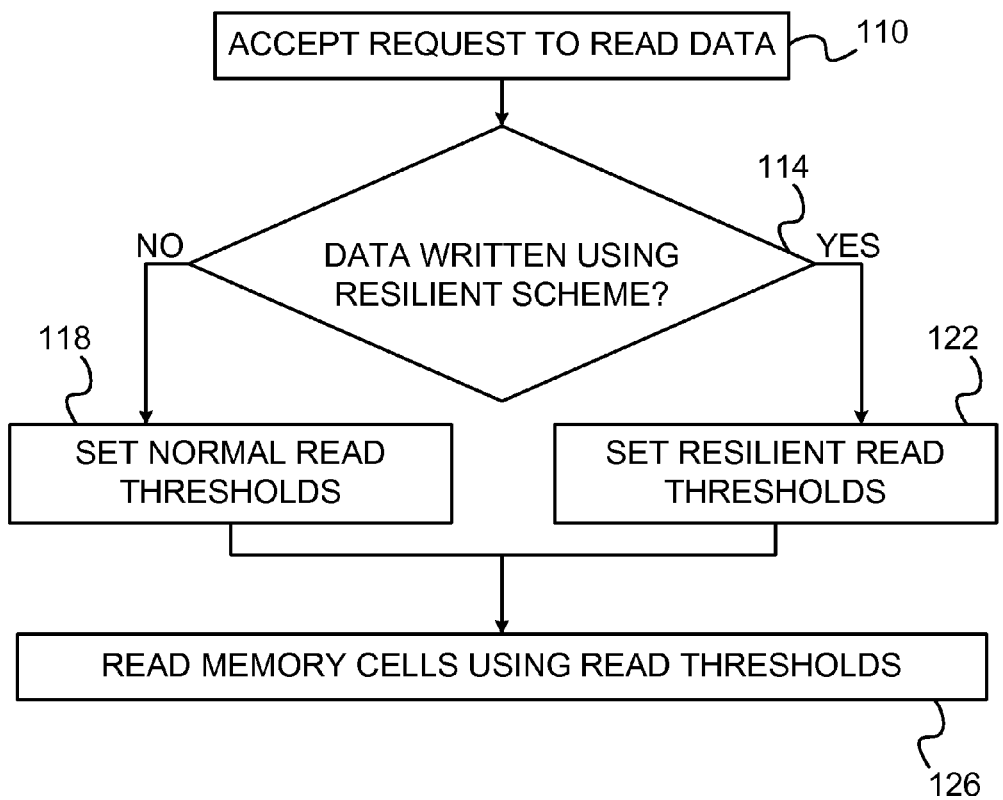
FIG. 5 is a flow chart that schematically illustrates a method for reading analog memory cells, in accordance with an embodiment of the present invention.

FIG. 5 is a flow chart that schematically illustrates a method for reading analog memory cells 32, in accordance with an embodiment of the present invention. The method of FIG. 5 can be used for reading data from multi-level cells, which have been programmed using the programming methods of FIGS. 3 and 4 above. The method begins with MSP 40 accepting a request from host 52 to retrieve certain data, at a read request step 110.

The MSP checks whether the data in question was stored using the normal programming scheme or using the resilient programming scheme, at a scheme checking step 114.

If the normal programming scheme was used, MSP 40 sets one or more read thresholds, which are suitable for reading cells that were programmed using the normal programming scheme, at a normal read setting step 118. Otherwise, i.e., if the resilient programming scheme was used, the MSP sets a different set of one or more read thresholds, which are suitable for reading cells that were programmed using the resilient programming scheme, at a resilient read setting step 122. R/W unit 36 reads the memory cells in question using the selected read thresholds, at a reading step 126. The reconstructed data is provided to the MSP, which sends the data to the host in response to the read request.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for data storage, comprising:
storing first data in analog memory cells using a first programming operation, which writes to the memory cells respective analog values representing respective bit values of the first data; and
storing in the analog memory cells second data in addition to the first data using a second programming operation, which modifies the respective analog values of the memory cells so as to represent bit value combinations of the first and second data,
wherein the first and second programming operations are defined such that, at all times during the second programming operation, the analog value of each memory cell remains unambiguously indicative of the respective bit value of the first data stored in that memory cell,
wherein the first and second programming operations are defined such that the analog values that are potentially reached during the second programming operation by the memory cells that store a first bit value of the first data are contained in a first range, and the analog values that are potentially reached during the second programming operation by the memory cells that store a second bit value of the first data, different from the first bit value, are contained in a second range that does not overlap the first range,
and comprising, following an interruption in the second programming operation, reconstructing the first data by reading the analog values from the memory cells using a read threshold positioned between the first and second ranges.

2. The method according to claim 1, wherein storing the first and second data comprises evaluating a condition with respect to the analog memory cells and, based on the condition, selecting to store the first and second data using one of a first version of the programming operations, in which at all times during the second programming operation the analog value of each memory cell remains unambiguously indicative of the respective bit value of the first data stored in that memory cell, and a second version of the programming operations that is different from the first version.

3. The method according to claim 2, wherein evaluating the condition comprises assessing whether the first and second data originate from different data items.

4. The method according to claim 2, wherein the analog memory cells are comprised in a memory device, wherein selection of the one of the first and second version is performed by circuitry that communicates with the memory device over an interface, and comprising reporting the selected version to the memory device via the interface.

5. The method according to claim 1, wherein the first programming operation represents a given bit value of the first data by analog values that are higher than the analog values representing the other bit value of the first data, and wherein storing the second data comprises applying the second programming operation to the memory cells holding the given bit value of the first data, and subsequently applying the second programming operation to the memory cells holding the other bit value of the first data.

6. A method for data storage, comprising:
storing first data in analog memory cells using a first programming operation, which writes to the memory cells respective analog values representing respective bit values of the first data; and
storing in the analog memory cells second data in addition to the first data using a second programming operation, which modifies the respective analog values of the memory cells so as to represent bit value combinations of the first and second data,
wherein the first and second programming operations are defined such that, at all times during the second programming operation, the analog value of each memory cell remains unambiguously indicative of the respective bit value of the first data stored in that memory cell,
wherein storing the first and second data comprises evaluating a condition with respect to the analog memory cells and, based on the condition, selecting to store the first and second data using one of a first version of the programming operations, in which at all times during the second programming operation the analog value of each memory cell remains unambiguously indicative of the respective bit value of the first data stored in that memory cell, and a second version of the programming operations that is different from the first version, and
wherein evaluating the condition comprises performing at least one action selected from a group of actions consisting of:
assessing a size of a data item to be stored in the analog memory cells;
identifying a pattern indicating an end of the data item to be stored in the analog memory cells; and
assessing an elapsed time since a previous programming operation.

7. A method for data storage, comprising:
storing first data in analog memory cells using a first programming operation, which writes to the memory cells respective analog values representing respective bit values of the first data; and
storing in the analog memory cells second data in addition to the first data using a second programming operation, which modifies the respective analog values of the memory cells so as to represent bit value combinations of the first and second data, wherein the first and second programming operations are defined such that, at all times during the second programming operation, the analog value of each memory cell remains unambiguously indicative of the respective bit value of the first data stored in that memory cell, wherein storing the first and second data comprises evaluating a condition with respect to the analog memory cells and, based on the condition, selecting to store the first and second data using one of a first version of the programming operations, in which at all times during the second programming operation the analog value of each memory cell remains unambiguously indicative of the respective bit value of the first data stored in that memory cell, and a second version of the programming operations that is different from the first version, and wherein the condition is evaluated after the first data was stored using the second version and before storing the second data, and comprising, upon selecting the first version, adjusting the analog values of at least some of the analog memory cells to match the first version of the programming operations.

8. A data storage apparatus, comprising:
a plurality of analog memory cells; and
circuitry, which is configured to store first data in a group of the analog memory cells using a first programming operation, which writes to the memory cells respective analog values representing respective bit values of the first data, and to store in the group of the analog memory cells second data in addition to the first data using a second programming operation, which modifies the respective analog values of the memory cells so as to represent bit value combinations of the first and second data, wherein the first and second programming operations are defined such that, at all times during the second programming operation, the analog value of each memory cell in the group remains unambiguously indicative of the respective bit value of the first data stored in that memory cell, wherein the first and second programming operations are defined such that the analog values that are potentially reached during the second programming operation by the memory cells that store a first bit value of the first data are contained in a first range, and the analog values that are potentially reached during the second programming operation by the memory cells that store a second bit value of the first data, different from the first bit value, are contained in a second range that does not overlap the first range, and wherein the circuitry is configured to reconstruct the first data following an interruption in the second programming operation by reading the analog values from the memory cells using a read threshold positioned between the first and second ranges.

9. The apparatus according to claim 8, wherein the circuitry is configured to evaluate a condition with respect to the analog memory cells and, based on the condition, to select to store the first and second data using one of a first version of the programming operations, in which at all times during the second programming operation the analog value of each memory cell remains unambiguously indicative of the respective bit value of the first data stored in that memory cell, and a second version of the programming operations that is different from the first version.

10. The apparatus according to claim 9, wherein the circuitry is configured to evaluate the condition by assessing whether the first and second data originate from different data items.

11. The apparatus according to claim 8, wherein the analog memory cells are comprised in a memory device, wherein the circuitry is separate from the memory device and communicates with the memory device over an interface, and wherein the circuitry is configured to report the selected version to the memory device via the interface.

12. The apparatus according to claim 8, wherein the first programming operation represents a given bit value of the first data by analog values that are higher than the analog values representing the other bit value of the first data, and wherein the circuitry is configured to store the second data by applying the second programming operation to the memory cells holding the given bit value of the first data, and subsequently applying the second programming operation to the memory cells holding the other bit value of the first data.

13. A data storage apparatus, comprising:
a plurality of analog memory cells; and
circuitry, which is configured to store first data in a group of the analog memory cells using a first programming operation, which writes to the memory cells respective analog values representing respective bit values of the first data, and to store in the group of the analog memory cells second data in addition to the first data using a second programming operation, which modifies the respective analog values of the memory cells so as to represent bit value combinations of the first and second data, wherein the first and second programming operations are defined such that, at all times during the second programming operation, the analog value of each memory cell in the group remains unambiguously indicative of the respective bit value of the first data stored in that memory cell, wherein the circuitry is configured to evaluate a condition with respect to the analog memory cells and, based on the condition, to select to store the first and second data using one of a first version of the programming operations, in which at all times during the second programming operation the analog value of each memory cell remains unambiguously indicative of the respective bit value of the first data stored in that memory cell, and a second version of the programming operations that is different from the first version, and wherein the circuitry is configured to evaluate the condition by performing at least one action selected from a group of actions consisting of:

assessing a size of a data item to be stored in the analog memory cells;
identifying a pattern indicating an end of the data item to be stored in the analog memory cells; and
assessing an elapsed time since a previous programming operation.

14. A data storage apparatus, comprising:
a plurality of analog memory cells; and
circuitry, which is configured to store first data in a group of the analog memory cells using a first programming operation, which writes to the memory cells respective analog values representing respective bit values of the first data, and to store in the group of the analog memory cells second data in addition to the first data using a second programming operation, which modifies the respective analog values of the memory cells so as to represent bit value combinations of the first and second data, wherein the first and second programming operations are defined such that, at all times during the second programming operation, the analog value of each memory cell in the group remains unambiguously indicative of the respective bit value of the first data stored in that memory cell, wherein the circuitry is configured to evaluate a condition with respect to the analog memory cells and, based on the condition, to select to store the first and second data using one of a first version of the programming operations, in which at all times during the second programming operation the analog value of each memory cell remains unambiguously indicative of the respective bit value of the first data stored in that memory cell, and a second version of the programming operations that is different from the first version, and wherein the circuitry is configured to evaluate the condition after storing the first data using the second version and before storing the second data, and, upon selecting the first version, to adjust the analog values of at least some of the analog memory cells to match the first version of the programming operations.

15. A data storage apparatus, comprising:

an interface, which is operative to communicate with a memory device comprising a plurality of analog memory cells; and circuitry, which is configured to store first data in a group of the analog memory cells using a first programming operation, which writes to the memory cells respective analog values representing respective bit values of the first data, and to store in the group of the analog memory cells second data in addition to the first data using a second programming operation, which modifies the respective analog values of the memory cells so as to represent bit value combinations of the first and second data, wherein the first and second programming operations are defined such that, at all times during the second programming operation, the analog value of each memory cell in the group remains unambiguously indicative of the respective bit value of the first data stored in that memory cell, wherein the first and second programming operations are defined such that the analog values that are potentially reached during the second programming operation by the memory cells that store a first bit value of the first data are contained in a first range, and the analog values that are potentially reached during the second programming operation by the memory cells that store a second bit value of the first data, different from the first bit value, are contained in a second range that does not overlap the first range, and wherein the circuitry is configured to reconstruct the first data following an interruption in the second programming operation by reading the analog values from the memory cells using a read threshold positioned between the first and second ranges.

* * * * *